(12) United States Patent
Seuntjens (10) Patent No.: US 6,294,738 B1
(45) Date of Patent: *Sep. 25, 2001

(54) SILVER AND SILVER ALLOY ARTICLES

(75) Inventor: Jeffrey M. Seuntjens, Spencer, MA (US)

(73) Assignee: American Superconductor Corporation, Westborough, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/831,504

(22) Filed: Mar. 31, 1997

(51) Int. Cl.[7] .................................................. H01B 12/00
(52) U.S. Cl. ....................... 174/125.1; 504/230; 504/740; 504/805
(58) Field of Search ..................... 174/125.1; 505/230, 505/430, 433, 704, 740, 805, 807, 813, 887

(56) References Cited

U.S. PATENT DOCUMENTS

| | | |
|---|---|---|
| 1,471,373 | 10/1923 | Woodward . |
| 4,067,753 | 1/1978 | Steine et al. ...................... 148/11.5 |
| 4,826,808 | 5/1989 | Yurek et al. ........................ 505/300 |
| 4,967,583 | 11/1990 | Watanabe et al. .................... 72/264 |
| 4,980,964 * | 1/1991 | Boeke ........................... 174/125.1 X |
| 4,983,574 * | 1/1991 | Meyer ........................... 174/125.1 X |
| 5,026,683 | 6/1991 | Ohkawa ................................. 505/1 |
| 5,075,285 | 12/1991 | Flükiger ............................... 505/203 |
| 5,189,009 | 2/1993 | Yurek et al. ......................... 505/124 |
| 5,232,906 | 8/1993 | Yamamoto et al. .................. 505/433 |
| 5,384,307 | 1/1995 | Lay ...................................... 505/430 |
| 5,434,129 * | 7/1995 | Motowidlo et al. .......... 174/125.1 X |
| 5,981,444 * | 11/1999 | Sawada et al. ...................... 505/433 |

FOREIGN PATENT DOCUMENTS

| | | |
|---|---|---|
| 64-10526 * | 1/1989 | (JP) . |
| 06 279994A | 10/1994 | (JP) . |

OTHER PUBLICATIONS

Gao et al., Superconducting Science and Technology, 5:318–326, 1992.
Otto et al., IEEE Transactions on Appl. Supercon, 5:1154–1157, 1995.
Sandhage et al., Journal of Metals, 43:21–25, 1991.
Yoo et al., "Long–Length Processing of BSCCO–2223 Tapes Made by Using Ag Sheath Alloys" (presented at Applied Superconductor Conference) Pittsburg, PA, Aug. 1996.

* cited by examiner

Primary Examiner—Jeffrey Gaffin
Assistant Examiner—Jeremy Norris
(74) Attorney, Agent, or Firm—Fish & Richardson P.C.

(57) ABSTRACT

A method for fabricating silver or silver alloy tube stock. The method provides silver or silver alloy tube stock with a structure that is substantially free of defects, has a fine grain size, and is amenable to uniform deformation. The silver or silver alloy tube stock is used to make silver-superconductor monofilament or multifilament precursor articles and composites.

17 Claims, 3 Drawing Sheets

SILVER AND SILVER ALLOY ARTICLES

The invention relates to tubes of silver and silver articles.

BACKGROUND OF THE INVENTION

Oxide superconductors exhibit superconductivity at relatively high temperatures in comparison to their traditional metallic counterparts. However, the oxide superconductors, being ceramics, are generally brittle and are difficult to process and manipulate. In contrast, composites of oxide superconductors supported by metal matrices, such as metal sheaths, have mechanical and electrical properties that are improved relative to the oxide superconductors alone. The metal sheath, matrix, or container, which holds the oxide superconductor powder prior to and during processing is typically composed of a noble metal such as silver or a silver alloy.

Oxide dispersion strengthened (ODS) silver alloys have been used as matrix materials, where the oxide dispersion increases the strength and hardness of the matrix. The use of silver and silver alloys in the production of silver-sheathed superconductor composites (silver-superconductor composites) is described, for example, in Lay, U.S. Pat. No. 5,384,307, Yamamoto, et al., U.S. Pat. No. 5,232,906, Flükiger, U.S. Pat. No. 5,232,906, and U.S. Ser. No. 08/626,130 filed Apr. 5, 1996 and entitled "Oxygen Dispersion Hardened Silver Sheathed Superconductor Composites," each of which is incorporated herein by reference.

Silver-sheathed superconductor composites require the fabrication of thick walled and large diameter silver tube stock (used as the metal sheath) for processing, however, available silver tube stock has primarily been prepared to the specifications of the jewelry industry and has relatively thin walls and small diameters. Larger articles of silver are available as cast ingots having diameters up to about 100 millimeters. The properties of the silver-superconductor composites are influenced by the starting grain size of the silver.

Cast silver is not well-suited for use in silver-superconductor composites due to the large average grain size and possible high level of porosity in the silver or silver alloy castings. In making these castings, only small temperature gradients exist in the solidifying metal due to the high thermal conductivity of the silver, which results in very large grains in the castings. The grain sizes typically can be on the order of 300 micrometers to a few millimeters in diameter. In addition, cast silver can have porosity due to bubble formation during cooling of the silver when the melt is not properly degassed. The high level of porosity occurs because the solubility of gases in solid silver is much lower than the solubility of gases in liquid silver. The large grain sizes and porosity lead to difficulties in silver-superconductor composite processing steps.

Presently, the process for preparing silver tube stock suitable for use in silver-superconductor composites is to cast molten silver into a tube up to about 50–75 millimeters in diameter. The cast silver tube is then drawn to the desired inner diameter (ID) or outer diameter (OD). Drawing of the cast silver tube to reduce its OD by a nominal factor of about 2 (an OD on the order of 25–35 millimeters) produces a number of flaws, such as folds, in the product that relate to the large initial grain size and high porosity of the cast silver tube. First, the large grains can exaggerate the formation of steps and folds on the inner surfaces of the drawn silver or silver alloy tube. These may extend up to 1 millimeter below the surfaces of the drawn tube. The steps and folds are typically formed on the inner surface due to the unsupported collapse of the inner diameter of the tube during drawing. Drawing a tube with insufficient mandrel support on the inside of tube can may cause folds in fine grains as well. Once created, the folds can only be removed by machining the effected portion of the surface, resulting in a yield loss of material. Second, the large grains can result in non-uniform deformation and formation of localized cracks or tears on the surface of the tube during processing. Cracks or tears can form either on the inner or outer surface of the tube during drawing. During drawing, junctions where three grain boundaries meet (grain boundary triple points) can open in early stages of drawing. These openings becomes lenticular during further drawing steps and eventually becomes an axial "split" in the silver tube of the monofilament The split remains in the monofilament, even though the drawing work eventually refines the silver grains to smaller grain sizes. The split can result in bridging between filaments in a multifilamentary composite configuration. Preferably, filaments are unbridged. Third, porosity in the cast silver material is not healed in the processing since the drawing forces are primarily tensile rather than compressive and are applied at or near room temperature.

The tube casting and tube drawing approaches to the production of silver or silver alloy tube stock needed to make silver-sheathed superconductor composites can be expensive. Tube casting is more expensive than cylindrical billet casting. The tube drawing process has yield loss on the ends of each drawn length. Tube drawn product must be post-machined to remove sizable surface defects such as the folds that can be up to 1 millimeter deep.

The requirements for cast and drawn silver or silver alloy monofilament processability, final tape performance, and processing costs indicate that alternative routes to silver or silver alloy tube stock are desirable. Moreover, defects and failures encountered in processed silver-superconductor composites suggest that silver or silver alloy tube quality needs to be improved. In addition, larger diameter, thicker wall silver or silver alloy tube stock than that typically used in the jewelry industry that is suitable for use in composite processing is needed.

One family of oxide superconductors includes bismuth-strontium-calcium-copper-oxide (BSCCO) compositions such as $Bi_2Sr_2CaCu_2O_8$ (BSCCO-2212) and $Bi_2Sr_2Ca_2Cu_3O_{10}$ (BSCCO-2223). The BSCCO superconductors include compositions where bismuth is partially substituted by dopants such as lead (that is, (Bi,Pb)SCCO). Other families of oxide superconductors include yttrium-barium-copper-oxide (YBCO) compositions, such as $YBa_2Cu_3O_7$ (YBCO-123), and thallium-barium-calcium-copper-oxide compositions.

The oxide superconductor-silver composites can be prepared in elongated forms such as wires and tapes by processes, such as the well-known powder-in-tube (PIT) process, that typically include a number of stages. In the PIT process, first, a powder of a precursor to a superconductor is prepared. The precursor can be a single material or a mixture of materials. Second, a silver or silver alloy container (for example, a tube, billet or grooved sheet) is filled with the precursor powder. The silver container serves as a matrix for constraining the superconductor. Third, the filled container is deformed in one or more iterations to reduce the cross-sectional area of the container in a draft reduction step. A number of filled containers (filaments) can be combined and surrounded by another silver or silver alloy matrix to form a multifilament article. Finally, the material is subjected to one or more deformation and annealing cycles which together form and sinter the oxide superconductor. This thermomechanical processing helps precursor grains align and grow to form a textured superconductor article, which is predominantly composed of one phase and has a high critical current density ($J_c$).

If the precursor powder is composed of one or more oxides, the process is known more specifically as oxide-powder-in-tube (OPIT) processing. If the precursor powder is composed of elemental metal alloys, the process is known more specifically as metal-powder-in-tube (MPIT) processing. See, for example, Yamamoto, et al., U.S. Pat. No. 5,232,906, Otto, et al., "Progress toward a long length metallic precursor process for multifilament Bi-2223 composite superconductors", *IEEE Transactions on Appl. Supercon.*, Vol. 5, No. 2 (January 1995), pp, 1154–1157, Yurek, et al., U.S. Pat. No. 4,826,808, Yurek, et al., U.S. Pat. No. 5,189,009, Gao et al., *Superconducting Science and Technology*, Vol. 5, 1992, pp. 318–326, and Sandhage, et al., "The oxide-powder-in-tube method for producing high current density BSCCO superconductors", *Journal of Metals*, Vol. 43, No. 3, 1991, pp. 21–25, each of which is incorporated herein by reference.

SUMMARY OF THE INVENTION

The invention relates to a new method for fabricating silver or silver alloy articles and tube stock. It is particularly useful for manufacturing thick-walled tube stock and articles having a minimum cross-sectional area greater than about 100 square millimeters. The invention features silver or silver alloy articles or tube stock with a structure that is substantially free of defects, has a fine grain size, and is amenable to uniform deformation. The silver or silver alloy tube stock can be used to make silver-sheathed superconductor monofilament or multifilament precursor articles and composites.

By "fine-grained silver or silver alloy" is meant silver or silver alloy which has an average grain size that is typically less than 300 micrometers, preferably less than 200 micrometers, more preferably less than 100 micrometers, even more preferably less than 50 micrometers, or, most preferably less than 20 micrometers. The maximum grain size is typically less than about 300 micrometers, preferably less than about 200 micrometers, more preferably less than about 100 micrometers, and most preferably less than about 50 micrometers. Articles with average grain sizes of 10–20 micrometers and maximum grain sizes typically less than about 50 micrometers may be obtained. The average and maximum grain sizes can be determined, for example, by metallography. Preferably, the metal tube is substantially free of porosity and has a surface that is substantially smooth and defect-free. A 3:1 ratio of maximum-to-average grain size is typical of silver or silver alloys produced by this process.

By "thick-walled" is meant a tube having a ratio of inner diameter to outer diameter in the range of about 0.60–0.85.

In one aspect, the invention relates to a method of manufacturing a fine-grained silver or silver alloy article independent of initial grain size of the silver or silver alloy. The article has a desired outer diameter and a desired cross-sectional area. First, the method features the step of providing an ingot of silver or a silver alloy having a long axis and an initial cross-sectional area at least 8 times greater than the desired cross-sectional area. Next, the method features the step of extruding the ingot through a die having a diameter approximately equal to the desired outer diameter of the article to produce the article.

In another aspect, the invention relates to a method of manufacturing a seamless metal tube comprising a fine-grained silver or silver alloy and having a desired inner diameter, a desired outer diameter, and a desired cross-sectional area determined by the desired outer diameter and the desired inner diameter. Preferably, the ratio of the desired inner diameter to the desired outer diameter is about 0.60 to 0.85. First, the method features the step of providing an ingot of silver or a silver alloy having a long axis and a hole parallel to the long axis and having a diameter approximately equal to the desired inner diameter of the seamless metal tube. The ingot has an initial cross-sectional area at least 8 times greater than the desired cross-sectional area. Second, the method features the step of inserting a mandrel having a diameter approximately equal to the desired inner diameter of the seamless metal tube into the hole of the ingot prior to the pressing step. Next, the method features the step of extruding the ingot through a die having a diameter approximately equal to the desired outer diameter of the seamless metal tube to produce the seamless metal tube and reduce the average and maximum grain size of the silver or silver alloy.

In another aspect, the invention features a method of reducing the grain size of a silver or silver alloy article having a desired outer diameter and a desired cross-sectional area. First, the method features the step of providing an ingot of silver or a silver alloy having a long axis and an initial cross-sectional area at least 8 times greater than the desired cross-sectional area. Next, the method features the step of extruding the ingot through a die having a diameter approximately equal to the desired outer diameter of the article to produce the article having a fine grain size.

The ingot can have a first average grain size and the article can have a second average grain size that is a factor of 50 to 200 times smaller than the first grain size. In other words, the average grain size is typically reduced by a factor of about 50 to 200. Fine-grained articles may be obtained independent of the ingot grain size.

The methods can include a heating step before extrusion and a cooling step after extrusion. Typical extrusion conditions suitable for silver or silver alloy tube extrusion include a 200 to 450° C. pre-heat of the ingot, preferably 260 to 340° C. After extrusion, the article is cooled. The preferred cooling rate is to cool the article to below nominally 200° C. and, preferably, room temperature within 5 minutes of the article exiting the extruder.

In preferred embodiments, the method features the steps of drilling a hole in the ingot and inserting a mandrel having a diameter approximately equal to the inner diameter of the tube into the hole of the ingot prior to the pressing step.

In other preferred embodiments, the method features the step of upsetting a silver or silver alloy casting having a diameter smaller than the average diameter of the extrusion ingot in a press to produce an upset ingot having a diameter larger than the diameter of the casting. The upset ingot preferably has an the average diameter of between 100 and 300 millimeters. The upsetting step can be repeated on the upset ingot to increase the average diameter of the upset ingot to between 150 and 300 millimeters.

In another aspect, the invention features a metal article with a minimum cross-sectional area greater than about 100 square millimeters including fine-grained silver or a silver alloy which is substantially free of major defects. The article may be machined to produce a surface that is substantially smooth and defect-free.

In another aspect, the invention features a thick-walled, seamless metal tube comprising silver or a silver alloy having an average grain size that is less than 200 micrometers and a maximum grain size less than 300 micrometers.

In another aspect, the invention features a superconducting article precursor including a superconductor or superconductor precursor contained in a thick-walled seamless metal tube composed of fine-grained silver or a silver alloy. The seamless metal tube calk have an outer diameter greater than 25 millimeters. The seamless metal tube can be substantially free of major defects. In another aspect, the invention features a method of manufacturing a composite superconducting article by treating the precursor article to obtain the superconducting article. The composite can be multifilamentary, the seamless metal tube can be substantially smooth-walled, and the superconducting article can be unbridged.

In other preferred embodiments, the average diameter of the ingot is between 100 and 300 millimeters and the outer diameter of the tube is between 25 and 100 millimeters.

The invention may provide one or more of the following advantages. Cast and drawn silver or silver alloy tube stock has large grain size, porosity, folds, cracks and splits in the tube which can lead to breakage during processing of the silver-superconductor composite, particularly in wire drawing where the defects act as stress risers under tensile load. Typically, the larger the casting diameter, the larger the grain size of the silver or silver alloy. In the case of processing multifilament composites, the filaments can be sausages or otherwise damaged without complete composite failure. The resulting defective multifilament composite can lead to forced current transfer to other filaments, degraded overall composite performance. The cast and drawn silver tube stock is not amenable to scale-up by, for example, upsetting, since larger tube sizes will not encounter the deformation needed to refine grain size during processing, resulting in even lower quality tube products. Moreover, larger cast silver or silver alloy tubes are not commercially available.

The extruded silver or silver alloy article is substantially free of major defects. In particular, the extruded tube stock is free of porosity, has a fine grain size and is free of surface folds and cracks. As a result, the extruded silver or silver alloy tube stock performs better in silver-superconductor composite processing due to improved tube quality. The extrusion pressure (typically over 700 MPa) closes casting porosity and routinely provides a fine-grained tube with preferred texture for uniform flow in subsequent silver-superconductor drawing processes. The lack of porosity and other major defects in the fine-grained silver or silver alloy contributes to smooth-walled, uniformly dense superconducting filaments. The improved properties of the silver or silver alloy tube stock can help eliminate bridging of filaments, which can be correlated with high $J_c$. The fine grain size helps eliminate folds and cracks on the surfaces of the tube. Due to the flexibility of processing conditions, the extruded tube stock has more consistent and predictable material properties than the cast and drawn material. In addition, extruded silver or silver alloy tube stock can be made with larger diameters (up to 75 millimeters in diameter) and with a range of wall thicknesses, including thick-walled tube stock.

The extrusion of the silver or silver alloy tube stock also eliminates processing steps and material loss (particularly processed material loss) in comparison to the cast and drawn processes of forming silver tubes. For example, uniform tube drawing processes can become difficult and unreliable when the superconductor powder fraction is greater than approximately 50 percent. The fine grain size of the tube can facilitate superconductor monofilament fabrication with high fill factors even in excess of 55 percent. Fill factor is the measured percentage of oxide superconductor in a cross section of the conductor, and is an important determinant of the overall current carrying capacity of the conductor. Moreover, the silver scrap from tube extrusion is recoverable at about 80 percent of the ingot purchase price.

A silver alloy is a mixture of one or more metals with silver, where silver is the dominant amount of material in the alloy. The metal dissolved in the silver can include gold, platinum, palladium, aluminum, magnesium, copper, lithium, sodium, potassium, calcium, beryllium, strontium, barium, yttrium, scandium, lanthanum, cerium, praseodymium, neodymium, promethium, samarium, europium, gadolinium, terbium, dysprosium, holmium, erbium, thulium, ytterbium, lutetium, titanium, zirconium, hafnium, vanadium, niobium, tantalum, silicon, germanium, antimony, tin, lead, gallium, indium, thallium, zinc, bismuth, or mercury. The preferred metals included in a silver alloy are gold, platinum, palladium, aluminum, magnesium, antimony, or copper. As used herein, "silver alloy" also encompasses silver containing a dispersion of oxide particles. Oxide dispersion strengthened (ODS) is described, for example, in Lay, U.S. Pat. No. 5,384,307, Yamamoto, et al., U.S. Pat. No. 5,232,906, Flükiger, U.S. Pat. No. 5,232,906, and U.S. Ser. No. 08/626,130 filed Apr. 5, 1996 and entitled "Oxygen Dispersion Hardened Silver Sheathed Superconductor Composites."

"Article," as used herein, means a wire, tape, cable, or other extruded shape. A superconducting article is an article that includes an oxide superconductor component, such as a tape, wire, or cable, and can be made up of a single oxide superconductor filament (monofilament) or a plurality of oxide superconductor filaments (multifilament).

"Extrusion ingot-to-article area reduction ratio" or "R," as used herein, means the ratio of the initial cross-sectional area of the upset silver ingot ($A_i$) to the final cross-sectional area of the extruded article ($A_f$). The cross-sectional area an object such as the article or ingot is determined by the outer diameter and, if present, the inner diameter of the object. The cross-sectional area of the object does not include any hole in the object; or any mandrel or liner dimension. For example, when the object is a tube, the cross-sectional area of the tube is equal to $\pi(\text{outer radius})^2 - \pi(\text{inner radius})^2$. The extrusion pressure, P, is related to R by the equation $P = k \ln(R)$, where k is a materials property. When R is greater than about 8 ($A_i \geq A_f$), the extrusion pressure and deformation at the appropriate temperature can be sufficient to close any residual porosity in the silver or silver alloy due to casting and to refine the silver or silver alloy grains. More preferably, R is greater than about 20.

"Extruding" or "extrusion," as used herein, means forcing or pressing a material through a die to give a shaped article. "Ingot," as used herein, means a piece of metal that is the source of material for extrusion or pressing. The ingot can be cylindrical. "Casting," as used herein, means a metal article that is prepared from molten metal that is solidified into the shape of the article, such as a circular cylindrical shape.

"Included angle," as used herein, means the full angle formed between the faces of the extrusion die as measured in a cross section of the die through the center of the die opening.

"Aspect ratio," as used herein, means the ratio of a first dimension of an article to a second dimension of the article. In the case of a cylinder, such as a silver casting, the aspect ratio is the ratio of the length to the diameter.

"Upset," as used herein, means to deform an article by pressing to increase one dimension and decrease another dimension, thereby decreasing the aspect ratio of the article. For example, a silver ingot having a length and diameter can be upset to give an upset ingot having a smaller length and a larger diameter.

Other features and advantages of the invention will be apparent from the description of the preferred embodiment thereof, and from the claims.

DETAILED DESCRIPTION

According to the invention, a silver tube is extruded from a cylindrical casting of silver (i.e., an ingot), such as the castings available from Handy & Harman, Fairfield, Conn. or A.T. Wall Company, Warwick, R.I. The largest suitable silver casting currently known by the inventors to be available has a diameter of approximately 114 millimeters, however, larger diameter silver starting material, required for larger diameter tube demands in order to achieve a suitable area reduction ratio, can be fabricated by upsetting the casting. The 114 millimeter diameter cast silver ingot can be upset in an extrusion press with a 150 millimeter diameter liner to yield an upset ingot with a diameter on the order of 150 millimeters. "Liner," as used herein, means the wall of material located on the inside of the extrusion press between the ram and the die that constrains the metal during pressing so that it flows through the die. Larger diameter silver starting materials can be fabricated by upsetting 150 millimeter diameter ingot in a larger diameter liner. Larger diameter materials are prepared byte sequential upset of the ingots to avoid buckling.

Figure 1:
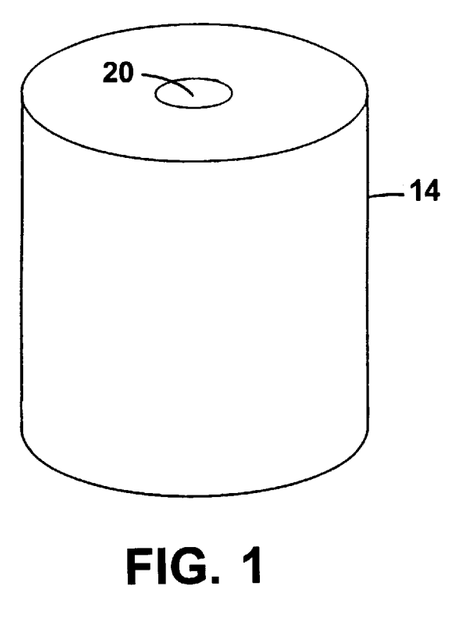
FIG. 1 is a perspective view of an ingot.

Referring to FIG. 1, the silver ingot with an appropriate radius is an ingot 14. A hole 20 having a diameter approximately equal to, but slightly larger than, the desired inner diameter of the tube is bored into ingot 14 along the cylindrical axis of the ingot 14. The hole 20, can be any diameter consistent with the area reduction ratio requirements for the tube extrusion. The ingot can be 30 inches or greater in length.

The ingot of silver or silver alloy having the hole is tube extruded in an extrusion press. The ingot is coated with a lubricant prior to placing the ingot in the extruder. The lubricant is preferably applied to the ingot prior to inserting the mandrel into the ingot or prior to inserting the ingot into the extrusion press. The lubricant can be sprayed or painted on the ingot. The lubricant preferably includes graphite, grease, or a combination thereof that does not substantially decompose during the extrusion process. It is preferred that the lubricant be removed from the tube after the pressing step.

Figure 2:
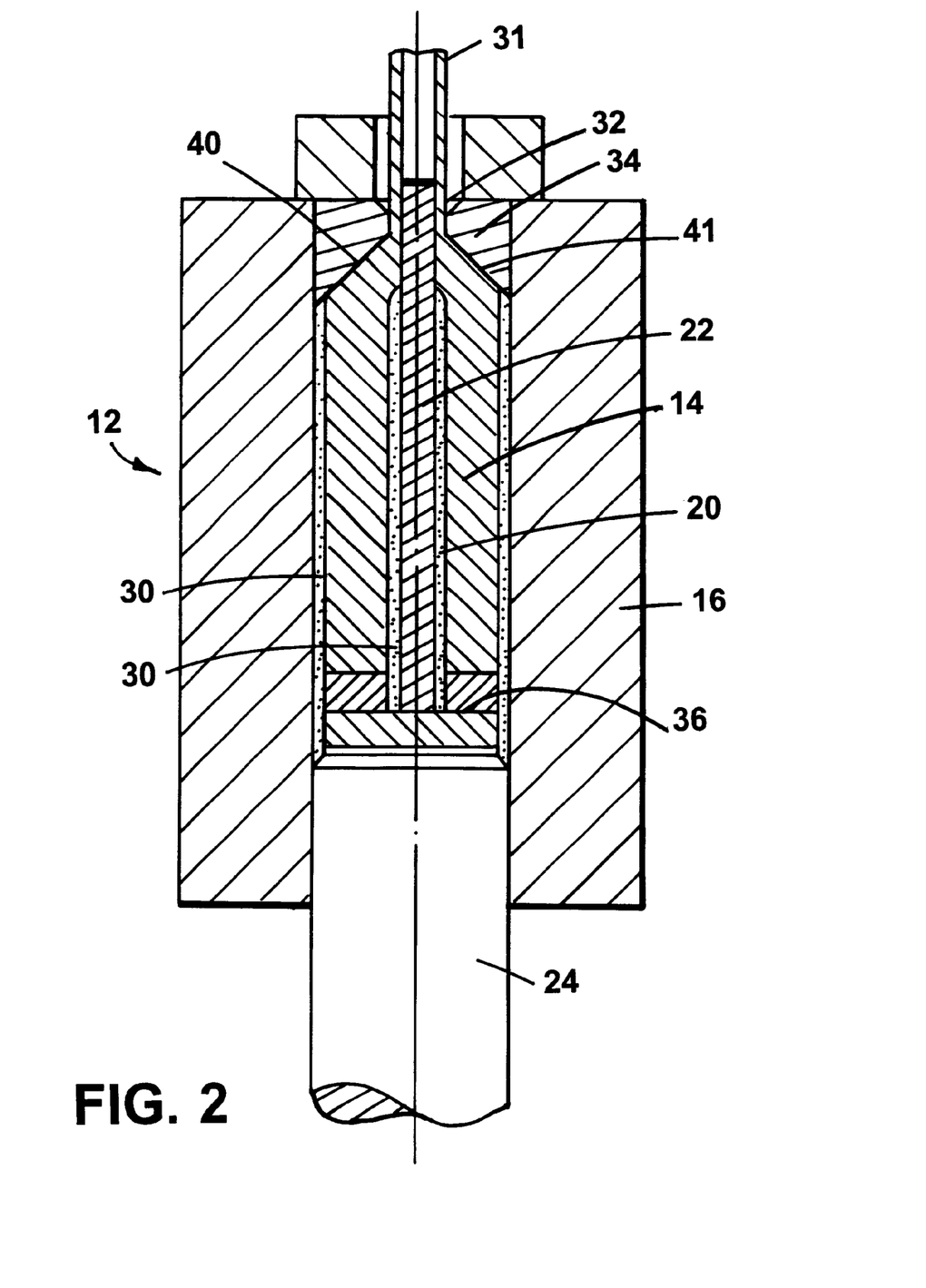
FIG. 2 is a cross-sectional view of an extruder.

Referring to FIG. 2, an extruder 12 includes silver ingot 14 within a liner 16 which contains the ingot during pressing. A mandrel is inserted through the ingot to produce a tube. Ingot 14 has a hole 20 along the long axis of the ingot. A mandrel 22 is inserted into the hole 20. Prior to extrusion, ingot 14 is warmed in a pre-heat step to facilitate extrusion.

A ram 24 enters liner 16 and pushes ingot 14 through the extruder. (FIG. 2 shows the ingot already partly extruded.) Extrusion of ingot 14 into an extruded tube 31 takes place by forcing or pressing the ingot/mandrel assembly through an opening 32 in a die 34. The included angle of die 34 is the angle between a surface 40 and a surface 41 of the die, which is typically around 45–120 degrees. A layer of lubricant 30 between mandrel 22 and the surface of hole 20 and between liner 16 and the outer surface of ingot 14 reduces friction and helps keep extrusion pressure low during processing.

Figure 3:
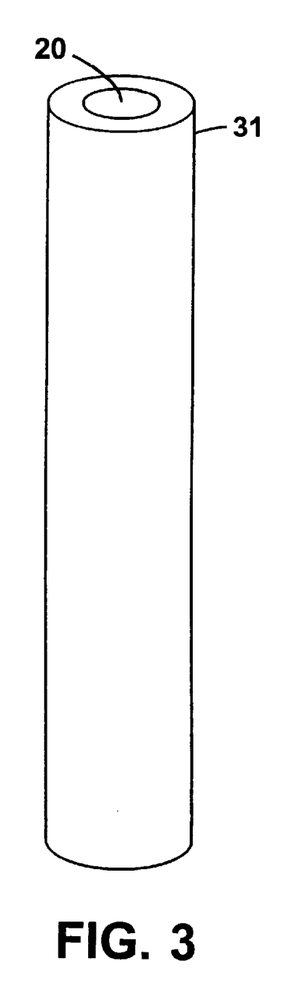
FIG. 3 is a perspective view of an extruded tube.

Referring to FIG. 3, tube 31 is extruded having hole 20 and mandrel 22 which defines the inner diameter of the tube. The mandrel 22, a silver or silver alloy article is obtained without hole 20.

Referring to FIG. 2, the diameter of opening 32 determines the final cross-sectional area and outer diameter of the extruded tube 31 and the diameter of liner 16 determines the initial cross-sectional area of the extrusion of ingot 14, the ratio of which is the area reduction ratio for the extrusion. As mentioned above, the area reduction ratio relates to the pressure, P, and the "k" for the process. The difference in the mandrel diameter and the extrusion die opening diameter corresponds to the tube wall thickness.

A follower block 36 is placed at the tail end of ingot 14, and, in response to ram 24, pushes all of the silver ingot through the die. The follower block is a relatively inexpensive metal, such as copper, that increases the yield of silver or silver alloy tube from the extrusion.

Typical extrusion conditions suitable for silver or silver alloy tube extrusion include a 4–9 millimeter per second ram speed, 200 to 450° C. pre-heat of the ingot, preferably 260 to 340° C. It is desirable to rapidly cool the extrudate in order to maintain the fine grain sizes during the extrusion. The cooling rate depends on the extrusion temperature and the cross-sectional area of the extruded article. Cooling rate is optimized to minimize grain growth. The preferred cooling rate is to cool the extrudate to below nominally 200° C. and preferably room temperature within 5 minutes of exiting the extruder.

The mandrel is a long rod having a diameter approximately equal to the inner diameter of the extruded tube. The diameter of the mandrel is small enough to slide through the hole in the ingot, but is close enough in diameter to the hole to avoid buckling of the mandrel during the upset immediately prior to extrusion of the silver or silver alloy through the die. The difference between the diameter of the mandrel and the diameter of the hole is between about 2% and 8% of the diameter of the hole, preferably about 5% of the diameter of the hole. The mandrel is made of a material that is hard enough to avoid deformation during extrusion, but is not brittle enough to break during the process. Examples of suitable mandrels are hardened steel having a Rockwell C hardness of about 50. For silver or silver alloy tube extrusion, the mandrel is much harder and much stronger than the silver or silver alloy under the extrusion conditions.

As noted above, the diameter of the ingot is approximately equal to the diameter of the liner, but smaller by about 1% to about 5%, and preferably about 2.5% of the diameter of the liner. The diameter of the ingot is small enough to slide into the liner. If the diameter of the ingot is significantly smaller than the diameter of the liner, the ingot is inserted into a fitting sleeve to reduce the difference in diameter. The fitting sleeve is welded to the ingot prior to extrusion by, for example, tungsten inert gas welding. The fitting sleeve is usually copper. Under optimized extrusion conditions, it may not be necessary to use the sleeve to modify the ingot diameter.

After extrusion, the silver or silver alloy tube is cooled. If a fitting sleeve was used, it can be peeled away from the tube after extrusion. A short section of the tube obtained can be contaminated with the follower block metal which co-extrudes with the silver or silver alloy at the end of the extrusion process. The contaminated region is cut from the end of the silver or silver alloy tube. A small portion of the inner and outer surfaces of the tube are machined to ensure removal of the lubricant. Between 0.05 and 0.20 millimeters of material can be removed from each surface to remove the lubricant, and up to 5 millimeters may be removed to ensure concentricity of the tube. Less machining is required in comparison to the tube casting and drawing process since extruded material does not contain the up to 1 millimeter deep surface defects described above. Extruded tube 31 can be sectioned to desired lengths.

Any diameter die openings can be used for silver or silver alloy tube extrusion to obtain tubes for other uses so long as the diameters of the liner and die are consistent with the area reduction ratio requirements for the extrusion process.

Extruded silver tube in accordance with the invention typically has an average grain size of less than 50 micrometers and is free of surface defects and casting porosity. The average grain size is typically about 50 to 200 times smaller than the average grain size of the initial silver casting, which typically has a minimum grain size of about 300 micrometers and average grain size of about 1 millimeter.

The uniform small grain size of the extruded silver tube allows subsequent silver-superconductor composite processing to rely on intrinsic silver properties of the tube. Previously, composite processing relied on the conditions required to process the defect-laden silver tube stock. The substantially defect-free, fine grain size, extruded silver tube stock can be used in uniform drawing processes in high fill factor composites even those with fill factors over 50% where it will overcome the material flaws in the drawn, thin-walled silver tube stock.

Upset of the casting to form larger diameter silver articles for extrusion is achieved in a press similar to that shown in FIG. 2, where the die is replaced with a solid block. A liner having the desired diameter is used and the ram press upsets the silver casting to the diameter of the liner.

A composite superconducting article can be prepared by, for example, the well-known powder-in-tube (PIT) process, that typically include a number of stages. In the PIT process, first, a powder of a precursor to a superconductor is prepared. The precursor can be a single material or a mixture of materials. Second, a metal container (for example, a tube, billet or grooved sheet) is filled with the precursor powder. The metal container serves as a matrix, constraining the superconductor. Third, the filled container is deformed in one or more iterations (with optional intermediate annealing steps) to reduce the cross sectional area of the container in a draft reduction step. A number of filled containers (filaments) can be combined and surrounded by another metal matrix to form a multifilament article. Finally, the material is subjected to one or more deformation and phase conversion heat treatment cycles which together form the desired oxide superconductor from the precursor and helps the oxide superconductor grains align and grow to from the textured superconductor article.

If the precursor powder is composed of one or more oxides, the process is known more specifically as oxide-powder-in-tube (OPIT) processing. See, for example, Rosner, et al., "Status of superconducting superconductors: Progress in improving transport critical current densities in superconducting Bi-2223 tapes and coils" (presented at the conference 'Critical Currents in High Tc Superconductors', Vienna, Austria, April, 1992), and Sandhage, et al., "The oxide-powder-in-tube method for producing high current density BSCCO superconductors", Journal of Metals, Vol. 43, No. 3, 1991, pp. 21–25, all of which are incorporated herein by reference.

Methods of preparing BSCCO superconducting materials, particularly lead-doped BSCCO, are described in U.S. Ser. No. 08/467,033 filed Jun. 6, 1995 and entitled "Processing of (Bi,Pb)SCCO Superconductor in Wires and Tapes," and U.S. Ser. No. 08/331,184 filed Oct. 28, 1994 and entitled "Production and Processing of (Bi,Pb)SCCO Superconductors," both of which are incorporated herein by reference. The composition of the precursor powder is controlled to improve processing of the precursor powder.

EXAMPLE

A length of a continuously-cast silver ingot was obtained from Handy and Harman. The product is nominally 114 millimeters in diameter, however, the diameter of the casting actually measured 108 millimeters with an ovality of ±0.50 millimeters. The casting was 293 millimeters long. The ovality was caused by the "caterpillar track" extraction of the ingot from the continuous caster process employed in its manufacture. Although metallography was not performed on the casting, the grains were visible to the unaided eye on the outer surface and were estimated to have an average diameter of 2 to 3 millimeters.

A machining fixture was built to hold the non-round casting in a lathe chuck so it could be rotated about its centroid for drilling the tube extrusion hole. A steady-rest was used to hold the other end of the casting. A 20 millimeter diameter hole was drilled parallel to the long axis of the casting, just over half way through the casting. The casting was turned around and the matching hole was drilled from the other side of the casting. The two holes met within an estimated 0.50 millimeter. A 20 millimeter ream was used to blend the axial holes, removing most of the "step" between the two drillings, as well as most of the drill bit scars, such as scratches and small folds, along the length of the hole. This hole represents a 3% yield loss of material from the as-received casting.

The tube was extruded on a 1300 metric ton press using a liner having a diameter of 115 millimeters. A rod-shaped steel mandrel having a diameter of 19 millimeters was used for the tube extrusion. The extrusion die opening had a diameter of 33 millimeters and a 90 degree included angle. The diameter of the liner and die opening represent extrusion area reduction ratio of 18.3. The recommended billet (ingot) OD was 111 millimeters, and because the ingot was under-sized, a copper sleeve was added to the casting. The casting was machined to a diameter of 109 millimeters and slid into a copper fitting sleeve with a 109 millimeter ID and 111 millimeter OD. The can was tungsten inert gas (TIG) welded to the silver without evacuation.

The billet was pre-heated to 427° C. for 2–3 hours to ensure uniform heating of the silver. A conservatively high temperature was used to ensure that the billet would not stall if the unknown mandrel friction was very high, but lower temperatures (260–370° C.) could be used. A copper follower was placed behind the billet and ahead of the mandrel to ensure extrusion of all of the silver off of the mandrel (the mandrel tip was about 300 millimeters past the die at the end of the extrusion). The ram speed was 4.2 millimeters per second for this extrusion. The extrudate was hand-placed into a water quench tank within 30 seconds after the extrusion.

The extrusion break-through force was 570 metric tons and the run force was 380 metric tons. The k factor was calculated to be 190 MPa at the break-through pressure and 130 MPa at the running flow. The extruded length was about 5.4 meters. The extrudate was cut in half for handling. The copper fitting sleeve was peeled off with a pliers. The billet yield of silver tube was high, well over 90%.

Figure 4:
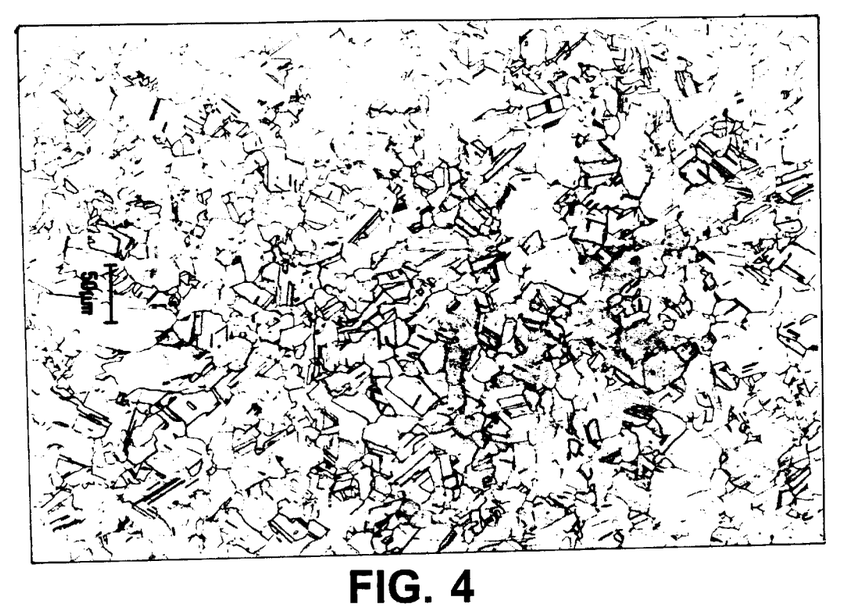
FIG. 4 is a metallograph of a cross section of the metal tube transverse to the direction of extrusion.
Figure 5:
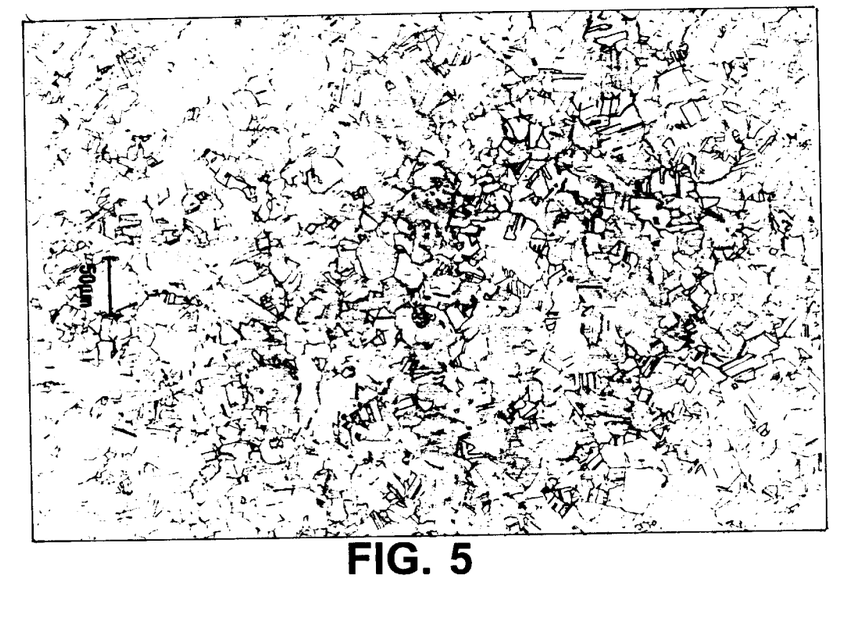
FIG. 5 is a metallograph of a cross section of the metal tube parallel with the direction of extrusion.

Metallography of the middle section was taken as a representative sample. Referring to FIGS. 4 and 5, transverse and longitudinal cross sections have indistinguishable microstructures under these extrusion conditions. The average grain size was estimated to be about 15 micrometers, with the largest grains having diameters of about 50 micrometers. The observed grains represented a 100-fold reduction in grain size from the initial silver casting and a 10-fold reduction in grain size over cast and drawn tube stock. A few large grains (up to 100 micrometers in diameter) remained immediately at the inner and outer surface. These are easily and ordinarily removed by machining or etching, since the extruded product must have 0.05 to 0.2 millimeters of material removed from inside and outside surfaces to ensure removal of the lubricant. There was no evidence of porosity or folds in the middle section of the extruded tube. In addition, the inner surface of the silver tube appears to be concentric with the outer surface of the tube; measurements of the wall thickness on the middle metallography section do not vary by more than 0.25 millimeters.

The equiaxed longitudinal microstructure indicates that the larger grains in the bulk of the material can be due in part to the higher than necessary extrusion temperature and delay in quenching of the extrudate used in this example. Smaller grain size may be achieved upon optimization of extrusion conditions by decreasing the temperature until the break-through pressure reaches about 80 percent of the press capacity, or by increasing the cooling rate after extrusion. However, the extrusion temperature must not be too cold, otherwise dynamic reactions can occur. For example, extrusions that are too cold may result in larger, elongated grains (unrefined grains) in the extruded product.

Other embodiments are within the claims.

What is claimed is:

1. A superconducting article precursor comprising a superconductor or superconductor precursor contained in a thick-walled, seamless metal tube comprising silver or a silver alloy.

2. The superconducting article precursor of claim 1, wherein the thick-walled, seamless metal tube has an outer diameter greater than 25 millimeters.

3. The superconducting article precursor of claim 1, wherein the seamless metal tube is substantially free of major defects.

4. A superconducting article precursor comprising a superconductor or superconducting precursor contained in a thick-walled, metal tube comprising silver or a silver alloy, wherein the metal tube has an average grain size less than 100 micrometers.

5. The superconducting article precursor of claim 4, wherein the metal tube is free of casting porosity.

6. The superconducting article precursor of claim 4, wherein the metal tube has an outer diameter greater than 2.5 millimeters.

7. The superconducting article precursor of claim 6, wherein the metal tube is seamless.

8. The superconducting article precursor of claim 4, wherein the average grain size is less than 20 micrometers.

9. The superconducting article precursor of claim 8, wherein the metal tube has a maximum grain size less than about 100 micrometers.

10. The superconducting article precursor of claim 9, wherein the maximum grain size is less than about 50 micrometers.

11. A superconducting article precursor comprising a superconductor or superconductor precursor contained in a thick-walled, metal tube comprising silver or a silver alloy, wherein the metal tube is free of casting porosity.

12. The superconducting article precursor of claim 11, wherein the metal tube has an outer diameter greater than 25 millimeters.

13. The superconducting article precursor of claim 11, wherein the metal tube is seamless.

14. A superconducting article precursor comprising a superconductor or superconductor precursor contained in a thick-walled, metal tube comprising silver or a silver alloy, wherein the metal tube is formed by extrusion.

15. The superconducting article precursor of claim 14, wherein the metal tube has an outer diameter greater than 25 millimeters.

16. The superconducting article precursor of claim 15, wherein the metal tube is formed by extruding a cast silver or silver alloy ingot having a bore therethrough.

17. The superconducting article precursor of claim 16, wherein the metal tube is seamless, substantially free of casting porosity, surface folds, and surface cracks, and has an average grain size of less than 100 micrometers.

* * * * *

UNITED STATES PATENT AND TRADEMARK OFFICE
CERTIFICATE OF CORRECTION

PATENT NO. : 6,294,738 B1
DATED : September 25, 2001
INVENTOR(S) : Jeffrey M. Seuntjens

It is certified that error appears in the above-identified patent and that said Letters Patent is hereby corrected as shown below:

Title page,
Item [56], References Cited, U.S. PATENT DOCUMENTS, "4,067,753" reference, delete "1/1978", insert -- 1/1977 --.
Item [57], ABSTRACT,
Line 1, insert -- new -- after the word "a"; delete period and insert -- is described. -- after "stock".

Column 12,
Line 2, delete "2.5", insert -- 25 --.

Signed and Sealed this

Sixth Day of September, 2005

JON W. DUDAS
*Director of the United States Patent and Trademark Office*